(12) United States Patent
Ivanov et al.

(10) Patent No.: US 7,746,695 B2
(45) Date of Patent: Jun. 29, 2010

(54) NON-VOLATILE SEMICONDUCTOR LATCH USING HOT-ELECTRON INJECTION DEVICES

(75) Inventors: Valeri Dimitrov Ivanov, Sofia (BG); Hartmut Liebing, Erfurt (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 943 days.

(21) Appl. No.: 10/596,401

(22) PCT Filed: Dec. 10, 2004

(86) PCT No.: PCT/EP2004/014104

§ 371 (c)(1),
(2), (4) Date: Jun. 12, 2006

(87) PCT Pub. No.: WO2005/059922

PCT Pub. Date: Jun. 30, 2005

(65) Prior Publication Data

US 2009/0147577 A1    Jun. 11, 2009

(30) Foreign Application Priority Data

Dec. 12, 2003    (EP) ................... 03028758

(51) Int. Cl.
*G11C 11/34*    (2006.01)
(52) U.S. Cl. .................. 365/185.08; 365/158; 365/157; 365/173; 365/49.13
(58) Field of Classification Search ................. 365/158, 365/157, 173, 49.13
See application file for complete search history.

(56) References Cited

U.S. PATENT DOCUMENTS

| 4,399,522 | A |   | 8/1983  | Kotecha et al. |
| 4,573,144 | A | * | 2/1986  | Countryman, Jr. ........ 365/185.1 |
| 5,428,571 | A |   | 6/1995  | Atsumi et al. |
| 5,648,930 | A | * | 7/1997  | Randazzo .............. 365/185.07 |
| 5,696,455 | A |   | 12/1997 | Madurawe et al. |

FOREIGN PATENT DOCUMENTS

GB    2054303    2/1981

OTHER PUBLICATIONS

International Search Report mailed Mar. 23, 2005.

* cited by examiner

*Primary Examiner*—Pho M Luu
*Assistant Examiner*—Tha-O Bui
(74) *Attorney, Agent, or Firm*—Hunton & Williams, LLP

(57) ABSTRACT

The invention concerns semiconductor latches capable of memorizing any programmed information even after power supply has been removed. Used is a μm BiCMOS EPROM process but it is applicable in any other process having hot electron injection devices like EPROM, Flash EEPROM. Suggested is a bi-stable latch circuit having a pair of cross-coupled branches (I,II), each branch including a complementary driver and a load connected between a drain line and a source line and a non-volatile memory cell having a program transistor and a read transistor, at least one of said drivers and loads including said read transistor, said driver and load of said branch connected in series at a respective output node, said read transistor and program transistor having a common floating gate and separate control gates, said control gate of said program transistor connected to a program voltage, the drain of said program transistor connected to a respective input node, said control gate of said read transistor in said branch connected to said output node of the other branch (II).

8 Claims, 2 Drawing Sheets

NON-VOLATILE SEMICONDUCTOR LATCH USING HOT-ELECTRON INJECTION DEVICES

CROSS REFERENCE TO RELATED APPLICATIONS

This application is a U.S. National Stage Application of International Application No. PCT/EP2004/14104, filed Dec. 10, 2004, which claims the benefit of European Patent Application No. EP 03028758.5, filed on Dec. 12, 2003, the disclosure of which is herein incorporated by reference in its entirety. PCT/EP2004/14104 designated the United States and was published in English.

FIELD OF THE DISCLOSURE

This invention concerns semiconductor latches capable of memorizing the programmed information even after their power supply has been removed. The invention may be applied to a 0.6 µm BiCMOS EPROM process but it is applicable in any other process having hot electron injection devices like EPROM, Flash EEPROM, etc.

BACKGROUND OF THE DISCLOSURE

Several types of non-volatile semiconductor latches are known in the prior art. They use different kind of non-volatile memory elements like fuses, MNOS transistors, EPROM transistors, standard EEPROM transistors, Flash EEPROM transistors, etc. Normally the transistor memory elements need a programming voltage relatively higher than the normal power supply. For many technological processes this means that almost all transistors in the non-volatile latch have to be made by high-voltage (HV) transistors instead of normal low-voltage (LV) transistors. As a result, the non-volatile latch area, a critical parameter, may increase a lot in size.

Additional problems exist in the non-volatile latches using hot-electron injection devices like EPROM and Flash EEPROM transistors. Normally they need a large current for programming, for example 0.5 to 1.0 mA/bit, in contrast to the standard EEPROM transistors using Fowler-Nordheim tunnel injection which takes, for example about 10 pA/bit. So, a disposal of hot-electron injection devices in a non-volatile latch, for example in the way described in GB-A 2 054 303 ("Hughes"), will require a large programming current flowing though the data line, respectively very large transistors along the drain programming path of the hot-electron injection devices. This will cause an additional increase of the non-volatile latch area and the area of its periphery.

In Hughes, the WHOLE non-volatile element, IGFET Q3, is included in the complementary driver (Q3, Q5—FIG. 1) or in the complementary load (Q1, Q3—FIG. 5). The same applies for the IGFET Q4 in the other branch. In the embodiments the non-volatile element (cell) is split in two parts—a read transistor and a program transistor. Only the read transistor T5 is included in the complementary driver (T1, T5—FIG. 1). The same applies for T6 in the other branch. The other part of the non-volatile element (cell) in the embodiments, the program transistor T7, is not included in the complementary driver (compare to GB 2 054 303, there CLAIMS, lines 46 to 49). The same applies for T8 in the other branch.

In Hughes the input data for programming the non-volatile (NV) latch are provided through a WRITE transistor Q9 (and Q11 in FIGS. 3 and 4) and applied to the respective nodes X (and Y in FIGS. 3 and 4). In the embodiments the input data for programming of the NV latch are applied on the drain of the program transistors T7 and T8, therefore the input data are decoupled from the respective output nodes Q and Q|(quer).

In Hughes the NV-latch is programmed by applying a high voltage (HV) on the control gate of the transistors Q3 or Q4 (See FIGS. 1 and 5), i.e. on the respective nodes X or Y. (See also rows 56 to 61 of the patent background). It means that all transistors (except Q10 and Q12) of this latch may be put under HV during programming. In the embodiments the NV latch is programmed by applying HV only on the node 19 (see FIGS. 1 and 3). Therefore the HV is decoupled from the respective output nodes Q and Q| and only the gates of the program transistors T7 and T8 are put under HV during programming.

In Hughes the NV-latch needs buffers (Q7, Q8) and/or READ transistors (Q10, Q12) between the respective nodes X and Y from one side and the DATA line from other side. (See also rows 53 to 56 of the claims). In the embodiments the NV latch nodes Q and Q| can be used directly as respective NV latch outputs.

The above-listed problems are solved by U.S. Pat. No. 5,428,571 to Atsumi et al. ("Atsumi"), which discloses splitting the hot-electron injection device into two parts: A reading transistor and a writing transistor with a common floating gate. But a limitation of this design solution is the use of depletion transistors that are not available in each process. Another limitation of this approach is that the threshold voltage of the depletion-type reading transistor has to be increased to positive values to avoid a static current in the non-volatile latch. This leads to strong requirements to the latch programming and decreases the data retention time of the latch.

In Atsumi the reading transistor (T4, all Figures) is depletion type (see also claims 1 and 12) whereas the writing transistor (T3, all Figures) is enhancement type. In the embodiments both the read transistor (T5, T6) and the program transistor (T7, T8) are enhancement type.

In Atsumi the NV latch needs additional protection means like the depletion transistor T2 (see also claims 1 and 12). In the embodiments the NV latch does not need such protection means. There is no depletion transistor at all in the proposed NV latch.

In Atsumi, the reading and the writing transistors have got a common control gate connected to Vpp/Vss (FIGS. 1, 2, 4 and 5). Only in FIG. 3 a variant with two control gates is shown but the control gate of the reading transistor T4 is connected to ground (Vss). In the embodiments the non-volatile cell (T5, T7) has got two separate control gates. The control gate of the read transistor T5 is connected to the respective output node Q|. The same for the other memory cell (T6, T8).

A Comparison between the inventive embodiments and U.S. Pat. No. 4,399,522 to Kotecha ("Kotecha") is as follows. In Kotecha, the non-volatile element 12 (FIG. 1) used in the RAM cell is ONE transistor with common drain 34, common source 36, common floating gate 24 and two control gates (30 and 46). The same applies for the other non-volatile element 14. Also in the inventive embodiments "a said transistor (i.e. one transistor) having first and second control gates, a floating gate". In the embodiments the non-volatile element (cell) used in the NV latch consists in fact of TWO transistors (T5 and T7) with only common the floating gate 13. In could be seen in all Figures that the drain (Q), the source (21) and the control gate (15) of T5 are different from the drain (D), the source (ground) and the control gate (17) of T7. The same for the non-volatile element (cell) used in the other branch—it also consists of TWO separate transistors T6 and T8 with only common the floating gate 14.

OBJECTS OF THE DISCLOSURE

An object of the invention is to provide a non-volatile latch using hot-electron injection devices. The high voltage for programming may be applied on a largely reduced number of elements for decreasing the total latch area.

Another object of the invention is to provide a reliable work and no static current even at a weak programming of the hot-electron injection devices.

A further object of the invention is the use of enhancement transistors only, so that it is applicable to any non-volatile process.

SUMMARY OF THE INVENTION

For achieving the above objects, a bi-stable non-volatile semiconductor latch is proposed. The bi-stable non-volatile semiconductor latch may have a pair of cross-coupled branches, each branch may include a complementary driver and a load connected between a drain line and a source line and also may include a non-volatile memory cell having a program transistor and a read transistor. Each driver may include a read transistor. The driver and the load of a branch may be connected in series at a respective output node. The read transistor and the program transistor in a branch may have a common floating gate and separate control gates. The control gate of the program transistor may be connected to a program voltage and its drain may be connected to a respective input node. The control gate of the read transistor in a branch may be connected to the output node of the other branch.

Exemplary embodiments enhance the understanding of the invention.

DETAILED DESCRIPTION OF THE DISCLOSURE

The following description is intended to convey a thorough understanding of the embodiments described by providing a number of specific embodiments and details involving non-volatile semiconductor latches which use hot-electron injection devices. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Figure 1:
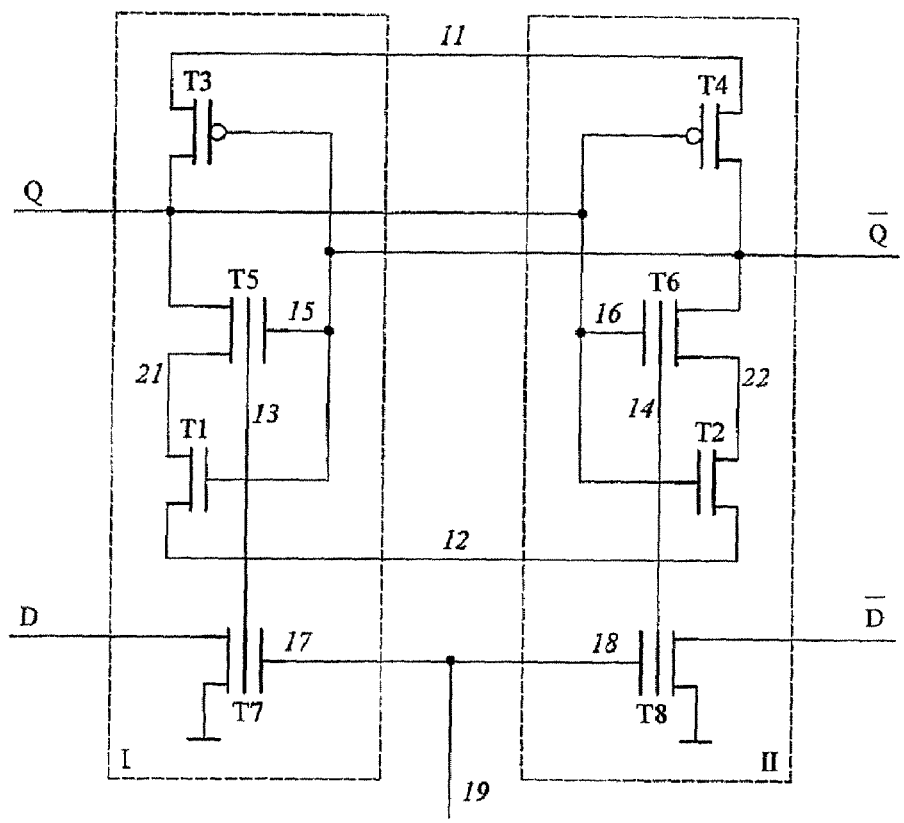
FIG. 1 represents a schematics circuit of an embodiment of the invention.

An exemplary embodiment of the invention is shown in FIG. 1. The non-volatile latch may include two branches, I and II. Branch I may have transistors T1, T3, T5 and T7. Branch II may have transistors T2, T4, T6 and T8. Transistors T1 and T2 may be LV NMOS transistors. Transistors T3 and T4 may be LV PMOS transistors and may represent the load of the respective branch. The source of transistors T3 and T4 may be connected to a drain line 11 which can be the common power supply line. The drain of transistor T3 may be connected to an output Q and the drain of transistor T4 may be connected to an inverted output $\bar{Q}$.

The read transistor T5 and the program transistor T7 may be parts of a non-volatile memory cell with a common floating gate 13. The read transistor T5 may be connected in series with transistor T1 between the output Q and a source line 12. Transistors T1 and T5 represent the driver of branch I.

The read transistor T6 and the program transistor T8 may be parts of another non-volatile memory cell with a common floating gate 14. The read transistor T6 may be connected in series with transistor T2 between the inverted output $\bar{Q}$ and the source line 12. Transistors T2 and T6 represent the driver of branch II.

The control gate 15 of the read transistor T5 and the gates of transistors T1 and T3 may be connected to the inverted output $\bar{Q}$. The control gate 16 of the read transistor T6 and the gates of transistors T2 and T4 may be connected to the output Q. These two cross-coupled connections make the non-volatile latch bi-stable.

The source line 12 can be connected to the common ground line in static mode but it may be disconnected (made floating) in program mode.

The drain of the program transistor T7 may be connected to a data input D. The drain of the program transistor T8 may be connected to an inverted data input $\bar{D}$. Both data inputs D and $\bar{D}$ may be set to ground in static mode. In program mode one of them may be raised to a middle range voltage, for example 7.5V for a 0.6 μm BiCMOS EPROM process, enough to generate hot electrons at the respective drain.

The source of the program transistors T7 and T8 may be connected to ground and their respective control gates 17 and 18 may be connected to a program voltage input 19. The program voltage may be set to the common power supply voltage in static mode, for example 5V. In program mode it may be raised to a higher value, for example 12.5V for the 0.6 μm BiCMOS EPROM process, so that this voltage is enough to inject hot electrons into the respective floating gate.

In some embodiments, the high programming voltage is applied only on the control gates 17 and 18 of the program transistors T7 and T8. So, all other transistors in the present non-volatile latch, including the input driving circuitry not shown in FIG. 1, can be standard LV MOS transistors with minimal dimensions for a layout area decrease.

Also the program voltage input can be common for a plurality of such non-volatile latches, so that HV MOS transistors can be placed only in a reduced HV switching peripheral circuitry. In this way an additional decrease of the total layout area can be achieved.

The programming of the non-volatile latch can be done by simultaneously applying pulses on the program voltage input 19 and a selected data input, for example D. At these conditions, the floating gate 13 traps charges by hot electron injection. The threshold voltage of the read transistor T5 may increase in respect to that of the read transistor T6.

In some embodiments, as both branches of the non-volatile latch are made symmetrical even a small difference between the threshold voltages of the read transistors T5 and T6 will be enough to turn the non-volatile latch in the correct programmed state after each subsequent turning off and on of the power supply. A person having ordinary skill in the art would recognize that the load at the outputs Q and $\bar{Q}$ has to be equal for a full symmetry.

In case of a weak programming the voltage on the floating gates 13 and 14 can be higher than the threshold voltages of the read transistors T5 and T6 during power on. Then the enhancement NMOS transistors T1 and T2 included in the drivers of the bi-stable latch may provide a zero current consumption in static mode.

Figure 2:
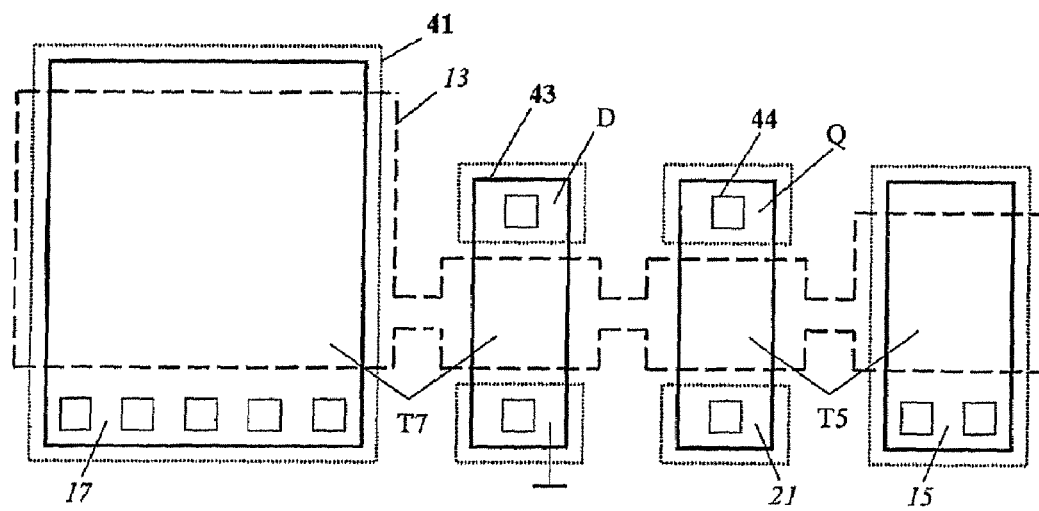
FIG. 2 shows a layout example of a read transistor and a program transistor with common floating gate in 0.6 μm one-poly-level BiCMOS EPROM process.

FIG. 2 represents the layout view of the memory cell including the read transistor T5 and the program transistor T7 in 0.6 μm one-poly-level BiCMOS EPROM process. The floating gate 13 may be made by polysilicon. The other process layers shown in FIG. 2 are: active area 43, collector implant (buried n+ layer) 41, and contact hole layer 44. The transistor terminals are named in the same way like in FIG. 1.

In some embodiments, as is shown in FIG. 2, the coupling ratio of the program transistor T7 is done bigger than that of the read transistor T5. This may be needed for improving the hot-electron injection efficiency since the control gate 15 may be held at a lower voltage than the control gate 17 in program mode.

A person having ordinary skill in the It is obvious for the skilled in the art that the memory cell shown in FIG. 2 can be done in many other different ways depending on the used non-volatile process. For example, a stacked polysilicon gate can be used for manufacturing (second polysilicon layer for the control gates).

Figure 3:
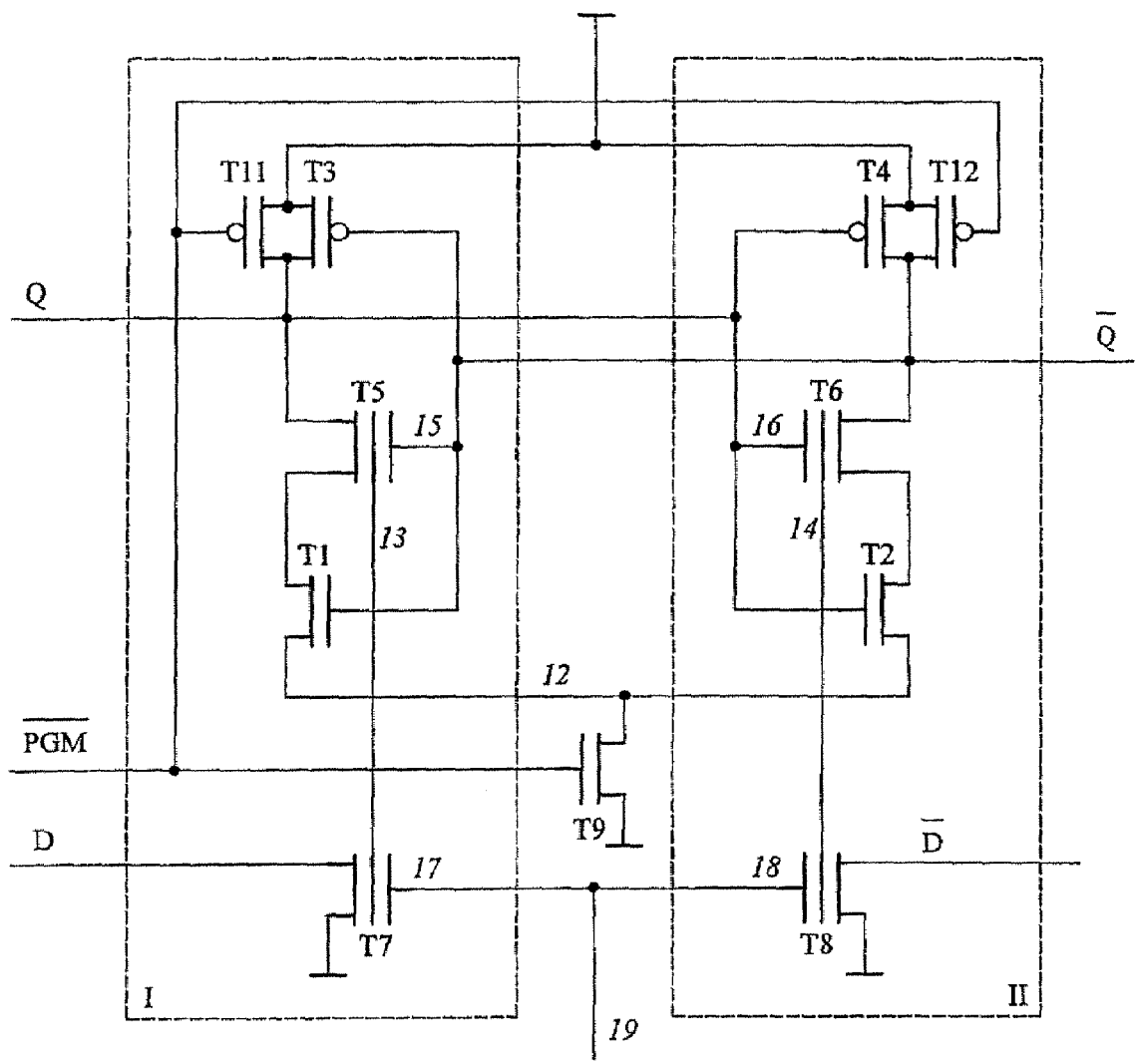
FIG. 3 represents a further embodiment of the invention.

FIG. 3 shows a more detailed exemplary embodiment of the invention. The drain line may be substituted by the common power supply line. The source line 12 is connected to ground through the NMOS transistor T9 in static mode ($\overline{PGM}$='1') whereas in program mode transistor T9 is turned off ($\overline{PGM}$='0') and the source line 12 is floating. The PMOS transistors T11 and T12 may be off in static mode bit in program mode they pull up the outputs Q and $\bar{Q}$ to the common power supply. In this way the non-volatile latch may easily turn in the correct programmed state after the programming pulse end.

All transistors in FIG. 3, including the input driving circuitry not shown in the picture, may be enhancement type transistors, so the implementation of the invention is easy in other non-volatile processes.

Accordingly, the embodiments of the present inventions are not to be limited in scope by the specific embodiments described herein. Further, although some of the embodiments of the present invention have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

The invention claimed is:

1. A bi-stable latch circuit having a pair of cross-coupled branches, each branch including a driver and a load, the branch connected between a drain line and a source line, and each branch providing a non-volatile memory cell having a program transistor and a read transistor, wherein:
    at least one of the driver and load of a branch includes the corresponding read transistor;
    said driver and load of each branch are connected in series and provide a respective output node;
    said read transistor and said program transistor of each branch have a common floating gate (13,14) and separate control gates;
    each control gate of each program transistor is connectable to a program voltage;
    a drain of each program transistor is connected to a respective input node;
    said control gate of said read transistor in each branch is connected to the output node of the other branch; and
    wherein said drain and source line are connectable across a common supply voltage in static mode and at least one of said drain and source lines is disconnectable from said common supply voltage in a program mode.

2. The bi-stable latch circuit according to claim 1, wherein at least one of said read transistor and said program transistor is a semiconductor device using hot electron injection for changing a threshold voltage thereof.

3. The bi-stable latch circuit according to claim 1, wherein the input nodes are held at logic low level in said static mode but the voltage at one of said input nodes is raised to a voltage level, high enough to generate hot electrons or hot holes at the drain of the respective program transistor in a program mode.

4. The latch circuit according to claim 1, wherein said program voltage is connected to said common supply voltage in said static mode but said program voltage level is raised to a voltage high enough to attract electrons or holes into said floating gate in said program mode.

5. A method for programming a bi-stable latch circuit, the bi-stable latch circuit having a pair of cross-coupled branches, each branch including a driver and a load, the branches connected between a drain line and a source line, and each branch providing a non-volatile memory cell having a program transistor and a read transistor, and wherein:
    at least one of the driver and load of a branch includes the corresponding read transistor;
    said driver and load of each branch are connected in series and provide a respective output node;
    said read transistor and said program transistor of each branch have a common floating gate and separate control gates;
    said control gates of said program transistors are connectable to a program voltage;
    a drain of each program transistor is connected to a respective input node;
    said control gate of said read transistor in each branch is connected to the output node of the other branch;
    the method comprising the steps of:
    holding input voltages that are applied to the input nodes of the program transistors at logic low level in a static mode; and
    raising at least one of said input voltages to a voltage value high enough to generate hot electrons or hot holes at the drain of the program transistors in a program mode.

6. The method according to claim 5 further comprising:
    connecting the program voltage of the control gates of the program transistors to a common supply voltage in the static mode; and
    raising said program voltage to a voltage level high enough to attract electrons or holes into the floating gate in the program mode.

7. A bi-stable latch circuit having a pair of cross-coupled branches, each branch including a complementary driver and a load and connected between a drain line and a source line, and each branch providing a non-volatile memory cell having a program transistor and a read transistor, wherein at least one of the driver and load of each branch includes the corresponding read transistor; said driver and load of each branch are connected in series and provide a respective output node; said read transistor and said program transistor have a common floating gate and separate control gates; the control gate of said program transistor is connectable to a program voltage; a drain of each program transistor is connected to a respective input node; and said control gate of said read transistor in each branch is connected to the output node of the other branch;

wherein at east one of said read transistor and program transistor is a semiconductor device using hot electron injection for changing a threshold voltage thereof;

and wherein said drain and source line are connectable across a common supply voltage in a static mode and at least one of said drain and source lines is disconnectable from said common supply voltage in a program mode.

8. The bi-stable latch circuit according to claim 7, wherein each read transistor being a part of the driver in each branch.

* * * * *